(12) United States Patent
Bauch et al.

(10) Patent No.: US 7,078,133 B2
(45) Date of Patent: Jul. 18, 2006

(54) PHOTOLITHOGRAPHIC MASK

(75) Inventors: Lothar Bauch, Dresden (DE); Robert Feurle, Neubiberg (DE); Ina Voigt, München (DE); Helmut Wurzer, Dresden (DE)

(73) Assignee: Infineon Technologies AG, Munich (DE)

( * ) Notice: Subject to any disclaimer, the term of this patent is extended or adjusted under 35 U.S.C. 154(b) by 144 days.

(21) Appl. No.: 10/353,463

(22) Filed: Jan. 29, 2003

(65) Prior Publication Data

US 2003/0152846 A1     Aug. 14, 2003

(30) Foreign Application Priority Data

Jan. 29, 2002  (DE) ............................... 102 03 357

(51) Int. Cl.
*G03F 9/00*     (2006.01)

(52) U.S. Cl. ............................................. 430/5; 430/30
(58) Field of Classification Search .................... 430/5, 430/30
See application file for complete search history.

(56) References Cited

U.S. PATENT DOCUMENTS

| | | | | |
|---|---|---|---|---|
| 6,001,512 A | * | 12/1999 | Tzu et al. | 430/5 |
| 6,022,644 A | | 2/2000 | Lin et al. | |
| 6,294,295 B1 | * | 9/2001 | Lin et al. | 430/5 |
| 2002/0006554 A1 | | 1/2002 | Fischer et al. | |

FOREIGN PATENT DOCUMENTS

| | | |
|---|---|---|
| DE | 100 21 096 A1 | 10/2001 |
| EP | 1 174 764 A2 | 1/2002 |

* cited by examiner

*Primary Examiner*—Christopher G. Young
(74) *Attorney, Agent, or Firm*—Laurence A. Greenberg; Werner H. Stemer; Ralph E. Locher

(57) ABSTRACT

A photolithographic mask has the advantage that a combination of dummy structures, whose pattern is imaged into the resist layer, and auxiliary structures, whose pattern is not imaged into the resist layer, makes it possible to achieve a significant improvement in the imaging properties of the main structures which are disposed at an edge of a region containing a multiplicity of main structures. In particular, constrictions at the structures can be significantly reduced or completely avoided and/or a so-called "tilting" of the structures under non-optimum focus conditions is significantly reduced or completely avoided.

6 Claims, 2 Drawing Sheets

PHOTOLITHOGRAPHIC MASK

BACKGROUND OF THE INVENTION

FIELD OF THE INVENTION

The present invention relates to photolithographic masks. The present invention relates, in particular, to photolithographic masks for the patterning of radiation-sensitive resist layers on semiconductor substrates for the fabrication of integrated or large scale integrated semiconductor components.

In the course of ever decreasing structure dimensions for the production of integrated or large scale integrated semiconductor components, a dimensionally accurate photolithographic transfer of mask structures to radiation-sensitive resist layers becomes more and more important. In the meantime, semiconductor components are fabricated with structure line widths of 180 nm or less for commercial use in large volumes, so that the requirements made of the patterning process steps must satisfy very high standards. In this case, the photolithographic transfer of mask structures to radiation-sensitive resist layers is one of the outstanding techniques for patterning layers on semiconductor components.

In this case, the photolithographic transfer of mask structures to a radiation-sensitive resist layer is affected in a plurality of steps. The alignment of the mask above the substrate covered with the radiation-sensitive resist layer is followed by the irradiation of the radiation-sensitive resist layer through the mask for selecting the resist layer material to be removed (or to be left). In this case, the irradiation of the radiation-sensitive resist layer can be effected in the silhouette method, the mask bearing on the resist layer (contact exposure) or being applied closely above the resist layer (proximity exposure). For very high resolution, patterning is carried out by a so-called projection exposure. In this case, the light that has passed through the mask is focused in a projection objective onto the resist layer, the projection objective imaging the maximum possible number of higher orders of diffraction produced by the mask structure. The imaging method makes it possible to image a minimum transferable structure line width, $b_{min}$, of $$b_{min}=k_1(\lambda/NA) \quad (1)$$

from the mask onto the resist layer. In this case, $\lambda$ is the wavelength with which exposure is effected, and NA is the numerical aperture, i.e. essentially a ratio of half the objective window diameter to the distance between wafer and objective. In the region of the resolution limit, the proportionality constant $k_1$ assumes values of $k_1<0.5$, and it is necessary to take particular measures for contrast intensification in order to ensure a sufficient process window in the lithography.

If the radiation-sensitive resist layer is a positive resist layer, then the exposure brings about at the exposed locations a chemical alteration of the resist layer material, which can be flushed out from the resist layer during development. In contrast, if the radiation-sensitive resist layer is a negative resist layer, then the non-exposed material is flushed out during development. In order to obtain the same structure as in the case of the positive resist, the mask must be patterned essentially complementarily with respect to the mask for the positive resist.

The irradiation and further steps, such as the initialization of the so-called photo acid generator (PAG), the so-called post exposure bake (PEB) and the setting of the diffusion gradient and thus of the resist profile, are followed by the development of the resist layer by spraying or spinning on developer liquid which selectively strips away (or selectively leaves resistant) the marked resist layer material. After the drying of the substrate, the patterned resist is finally obtained, which, in conclusion, is generally subjected to a thermal step for curing.

At the end, the minimum structure line width on the mask which is actually produced after the production of the resist structure is greater than that calculated from (1), for a number of reasons. First, the resist layer has a finite thickness, so that the imaging blurs slightly; furthermore, the developer acts isotropically, so that the resist is also removed in the lateral direction during the development of the resist layer. The minimum structure line width on the mask that is required for the production of a resist layer structure on a semiconductor substrate therefore depends on many parameters and is determined individually for each patterning process.

The mask contains e.g. an unpatterned quartz glass substrate that is light-transmissive even in the UV region and on which a thin light-opaque layer, usually made of black chromium, is applied. The black chromium layer produces, together with the transmissive regions, the mask structure that is imaged onto the resist layer. In this case, the black chromium layer produces the darkened regions on the resist layer, while the light-transmissive region produces the exposed regions on the resist. If the resist is positive, then the rate of removal of the resist in the developer is drastically increased in the exposed regions in comparison with the unexposed regions and removed by the development step. If the resist is negative, then the resist cross-links in the exposed regions so that predominantly the unexposed regions are removed during development. For a dimensionally accurate structure transfer it is furthermore important to ensure a homogeneous exposure dose over the region to be exposed.

Various effects can contribute to impairing the dimensional fidelity. First, the finite resist contrast $\gamma$, which is a measure of the resist removal gradient for a given exposure dose, causes rounding of originally cornered mask structures. Furthermore, interference effects, diffraction effects and scattered light which arise at structure elements of the mask, the resist layer and/or the prepatterned substrate surface can result in the effective exposure dose not being homogeneous in the resist layer regions.

Problems often arise, in particular at the edge of a region with structures that are disposed relatively densely, in that the structures at the edge of the region are not imaged correctly. While the structures in the inner part of the region support one another under suitable irradiation conditions, this positive effect ceases to apply at the edge of the region. Thus, at the edge of the region, under non-optimum focus conditions, by way of example, constrictions occur at the structures and/or a so-called "tilting" of the structures is observed. This has led to an increased risk of defects and to significant losses of yield.

SUMMARY OF THE INVENTION

It is accordingly an object of the invention to provide a photolithographic mask that overcomes the above-mentioned disadvantages of the prior art devices of this general type, which reduces or completely avoids the problems described.

With the foregoing and other objects in view there is provided, in accordance with the invention, a photolithographic mask for use in irradiating radiation-sensitive resist layers on semiconductor substrates for fabricating integrated semiconductor products. The photolithographic mask contains at least one radiation-transmissive substrate, and at least one layer disposed on the radiation-transmissive substrate and selected from the group consisting of radiation-opaque layers and half-tone layers. The layer has at least one region with a multiplicity of main structures. The main structures are formed such that a pattern formed by the main structures are transferred to a resist layer in a event of irradiation and first structures produced by the main structures fulfill a predetermined purpose on a semiconductor substrate of a completed semiconductor product. The layer further has dummy structures disposed at least at an edge of the region. The dummy structures are formed such that a pattern formed by the dummy structures is transferred to the resist layer in the event of the irradiation and second structures produced by the dummy structures do not fulfill a predetermined purpose on the semiconductor substrate of the completed semiconductor product. The layer additionally has at least one auxiliary structure disposed at least at the edge of the region. The auxiliary structure is formed such that a pattern formed by the auxiliary structure cannot be transferred to the resist layer in the event of the irradiation.

The photolithographic mask according to the invention has the advantage that a combination of dummy structures, whose pattern is imaged into the resist layer, and auxiliary structures, whose pattern is not imaged into the resist layer, makes it possible to achieve a significant improvement in the imaging properties of the main structures at the edge of the region. In particular, constrictions at the structures can be significantly reduced or completely avoided and/or a so-called "tilting" of the structures under non-optimum focus conditions is significantly reduced or completely avoided.

A similar effect can also be achieved solely with the aid of dummy structures without the use of auxiliary structures. However, since a larger number of dummy structures or larger dummy structures have to be used in this case, such an embodiment has the disadvantage that the area requirement on a semiconductor substrate is significantly increased. In particular, the distance between two adjacent regions of main structures can be significantly reduced by using auxiliary structures. Using dummy structures alone furthermore has the disadvantage that the additional dummy structures or the larger dummy structures may overlap further structures that already exist or are yet to be produced, for example substrate contacts, at the edge of the region, as a result of which undesirable leakage paths may arise. Moreover, in the case where only dummy structures are used, the dummy structures generally have a more complicated form or configuration, which adversely affects the complexity in the creation of the mask.

In connection with the present invention, a half-tone layer is to be understood as a layer which is radiation-transmissive to a certain percentage and which shifts the phase of the radiation passing through it by a predetermined magnitude. Depending on the application, the main or auxiliary structures may be formed from partial regions of the radiation-opaque layer or the half-tone layer or as openings in the radiation-opaque layer or the half-tone layer.

In accordance with one preferred embodiment of the photolithographic mask according to the invention, the main structures are oriented substantially parallel in a first direction. A parallel orientation of the main structures results in regular configurations that can generally be imaged well. The main structures or the segments from which the main structures are often composed generally have a form that has a significantly larger extent along one direction (longitudinal direction) than in a direction perpendicular thereto. The main structures or the segments thereof typically have a rectangle-like form that is significantly longer than it is wide. Accordingly, it can be stated that the main structures or the segments of the main structures are oriented in one direction, namely their longitudinal direction. The same also applies correspondingly to the dummy structures or auxiliary structures.

In accordance with one preferred embodiment of the photolithographic mask according to the invention, the dummy structures are oriented essentially parallel. In this case, it is particularly preferred if they are oriented parallel to the main structures in the first direction.

In accordance with a further preferred embodiment of the photolithographic mask according to the invention, a multiplicity of auxiliary structures are oriented essentially parallel, preferably in the first direction, are provided.

With the foregoing and other objects in view there is further provided, in accordance with the invention, a photolithographic mask for use in irradiating radiation-sensitive resist layers on semiconductor substrates for fabricating integrated semiconductor products. The photolithographic mask contains at least one radiation-transmissive substrate and at least one layer disposed on the radiation-transmissive substrate and selected from the group consisting of radiation-opaque layers and half-tone layers. The layer has at least one region with a multiplicity of main structures. The main structures are formed such that a pattern formed by the main structures is transferred to a resist layer in an event of irradiation. The main structures are oriented substantially parallel in a given direction. The layer further has a multiplicity of auxiliary structures disposed at least at an edge of the region. The auxiliary structures are formed such that a pattern formed by the auxiliary structures cannot be transferred to the resist layer in the event of the irradiation, and the auxiliary structures are oriented substantially parallel in the given direction.

The photolithographic mask according to the invention has the advantage that the use of the auxiliary structures, whose pattern is not imaged into the resist layer, makes it possible to achieve a significant improvement in the imaging properties of the main structures at the edge of the region. In particular, constrictions at the structures can be significantly reduced or completely avoided and/or a so-called "tilting" of the structures under non-optimum focus conditions is significantly reduced or completely avoided.

Since dummy structures can be dispensed with in the case of this embodiment, this embodiment has the advantage that the area requirement on a semiconductor substrate is again significantly reduced. In particular, the distance between two adjacent regions of main structures can be significantly reduced by virtue of the exclusive use of auxiliary structures.

Other features which are considered as characteristic for the invention are set forth in the appended claims.

Although the invention is illustrated and described herein as embodied in a photolithographic mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
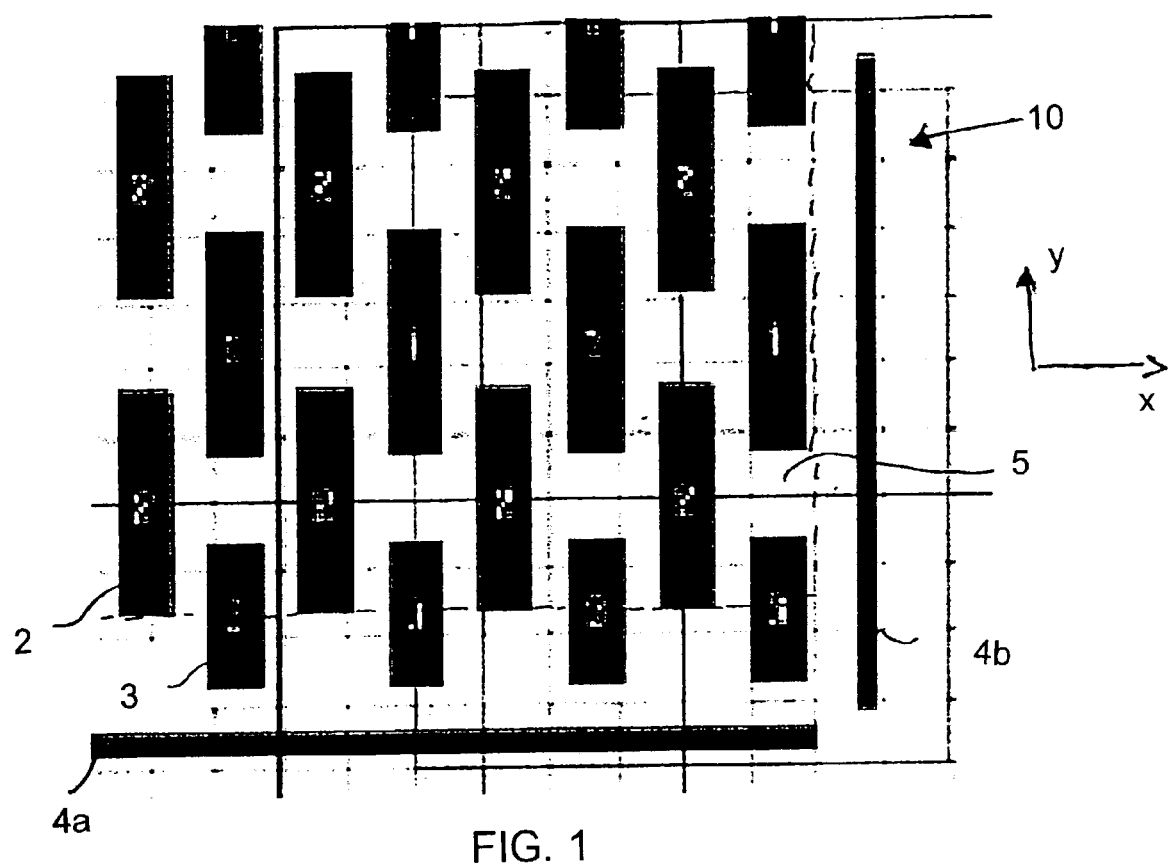
FIG. 1 is a diagrammatic, plan view of a first embodiment of a photolithographic mask according to the invention.

Referring now to the figures of the drawing in detail and first, particularly, to FIG. 1 thereof, there is shown a photolithographic mask in accordance with a first embodiment of the present invention in a plan view. The embodiment show in FIG. 1 has a radiation-transmissive substrate 10, for example made of quartz glass, to which a radiation-opaque layer is applied. By way of example, black chromium may be used as material for the radiation-opaque layer. Instead of a radiation-opaque layer, however, it is also possible to use a layer made of half-tone material, for example a $MoSi_2O_xN_y$ layer.

The radiation-opaque layer has been patterned to form main structures 2, dummy structures 3 and auxiliary structures 4a and 4b. In this case, the main structures 2 are formed in such a way that the pattern formed by the main structures 2 is transferred to the resist layer in the event of irradiation and the structures produced by the main structures 2 fulfill a predetermined purpose on the semiconductor substrate in the completed semiconductor product. In the example shown in FIG. 1, the structures produced by the main structures 2 form the so-called "active areas" on the semiconductor substrate.

The dummy structures 3 are likewise formed in such a way that the pattern formed by the dummy structures 3 is transferred to the resist layer in the event of irradiation. However, the structures produced by the dummy structures 3 do not fulfill a predetermined purpose on the semiconductor substrate in the complete semiconductor product.

Furthermore, auxiliary structures 4a and 4b are provided on the mask shown in FIG. 1, the auxiliary structures being formed in such a way that the pattern formed by the auxiliary structures 4a and 4b is not transferred to the resist layer in the event of irradiation.

The main structures 2 shown in FIG. 1 form a region 5 of main structures which are essentially disposed densely and which have sufficiently good imaging properties on account of the dense configuration, so that, in the inner part of the region 5, generally it is not necessary to use further measures to improve the imaging properties. Thus, while the structures in the inner part of the region 5 support one another under suitable irradiation conditions, this positive effect ceases to apply at the edge of the region 5. Therefore, at the edge of the region 5, under non-optimum focus conditions, by way of example, constrictions would occur at the structures and/or a "tilting" of the structures would occur. These negative effects occur in intensified fashion at the a edge of the region, since here the short sides of the main structures 2 form the edge of the region 5.

The mask shown in FIG. 1 avoids these difficulties largely by virtue of the provision of a combination of the dummy structures 3 and auxiliary structures 4a, 4b at the lower end of the region, as a result of which it is possible to achieve a significant improvement in the imaging properties of the main structures at the edge of the region. In particular, constrictions at the structures can be significantly reduced or completely avoided and/or a so-called "tilting" of the structures under non-optimum focus conditions is significantly reduced or completely avoided.

In the case of the embodiment shown in FIG. 1, the main structures 2 are oriented essentially parallel in a first direction (Y direction). The dummy structures 3 are likewise oriented essentially parallel in the first direction (Y direction). In contrast, the auxiliary structure 4a is oriented perpendicularly to the main or dummy structures in a second direction (X direction).

In order to improve the imaging properties of the main structures 2, at the right-hand edge of the region 5, a further auxiliary structure 4b is provided, which is oriented parallel to the main or dummy structures in the first direction (Y direction).

In particular at the lower edge of the region 5, a similar effect can also be achieved solely with the aid of the dummy structures 3 without the use of auxiliary structures. However, since a larger number of dummy structures or larger dummy structures have to be used in this case, such an embodiment has the disadvantage that the area requirement on a semiconductor substrate is significantly increased. In particular, the distance between two adjacent regions of main structures can be significantly reduced by using the auxiliary structures. Using dummy structures alone furthermore has the disadvantage that the additional dummy structures or the larger dummy structures may overlap further structures that already exist or are yet to be produced, for example substrate contacts, at the edge of the region, as a result of which undesirable leakage paths may arise. Moreover, in the case where only dummy structures are used, the dummy structures generally have a more complicated form or configuration, which adversely affects the configuration complexity in the creation of the mask.

Figure 2:
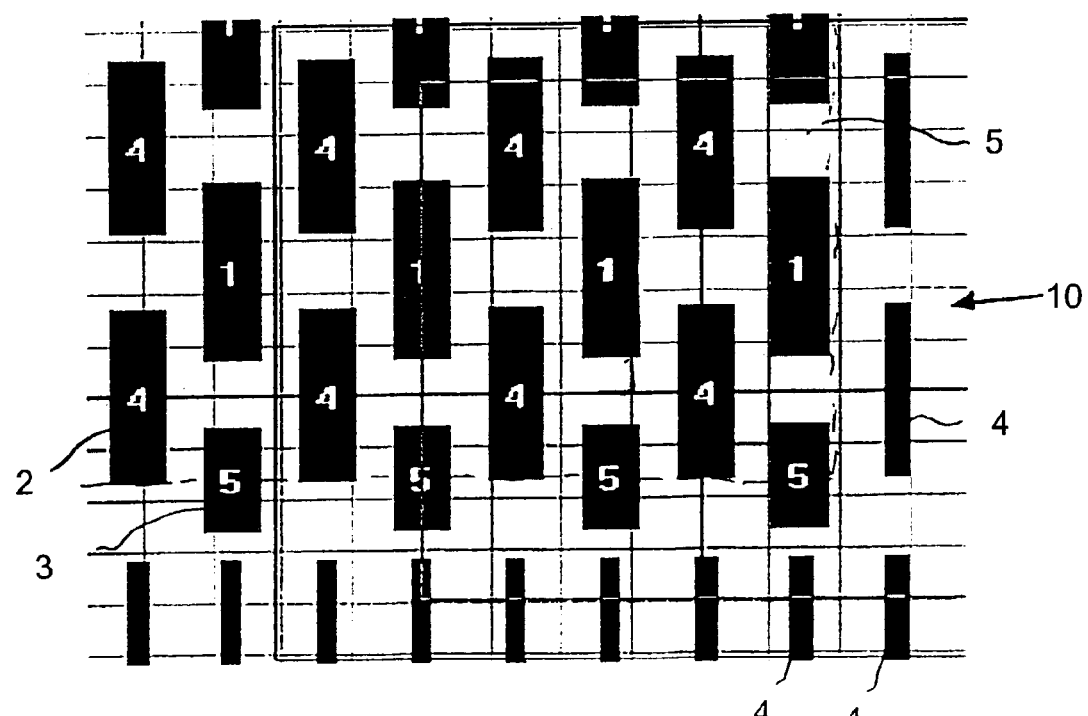
FIG. 2 is a plan view of a second embodiment of the photolithographic mask.

FIG. 2 shows a photolithographic mask in accordance with a second embodiment of the present invention in a plan view. The embodiment shown in FIG. 2 likewise has the radiation-transmissive substrate 10, for example made of quartz glass, to which a radiation-opaque layer is applied. By way of example, black chromium may be used as material for the radiation-opaque layer. Instead of the radiation-opaque layer, however, it is also possible to use a layer made of half-tone material, for example a $MoSi_2O_xN_y$ layer.

The radiation-opaque layer has again been patterned to form the main structures 2, the dummy structures 3 and the auxiliary structures 4. In contrast to the embodiment shown in FIG. 1, in the case of the embodiment shown in FIG. 2, all of the auxiliary structures 4, including the auxiliary structures 4 at the lower edge of the region 5, are oriented parallel to the main or dummy structures in the first direction (Y direction).

Figure 3:
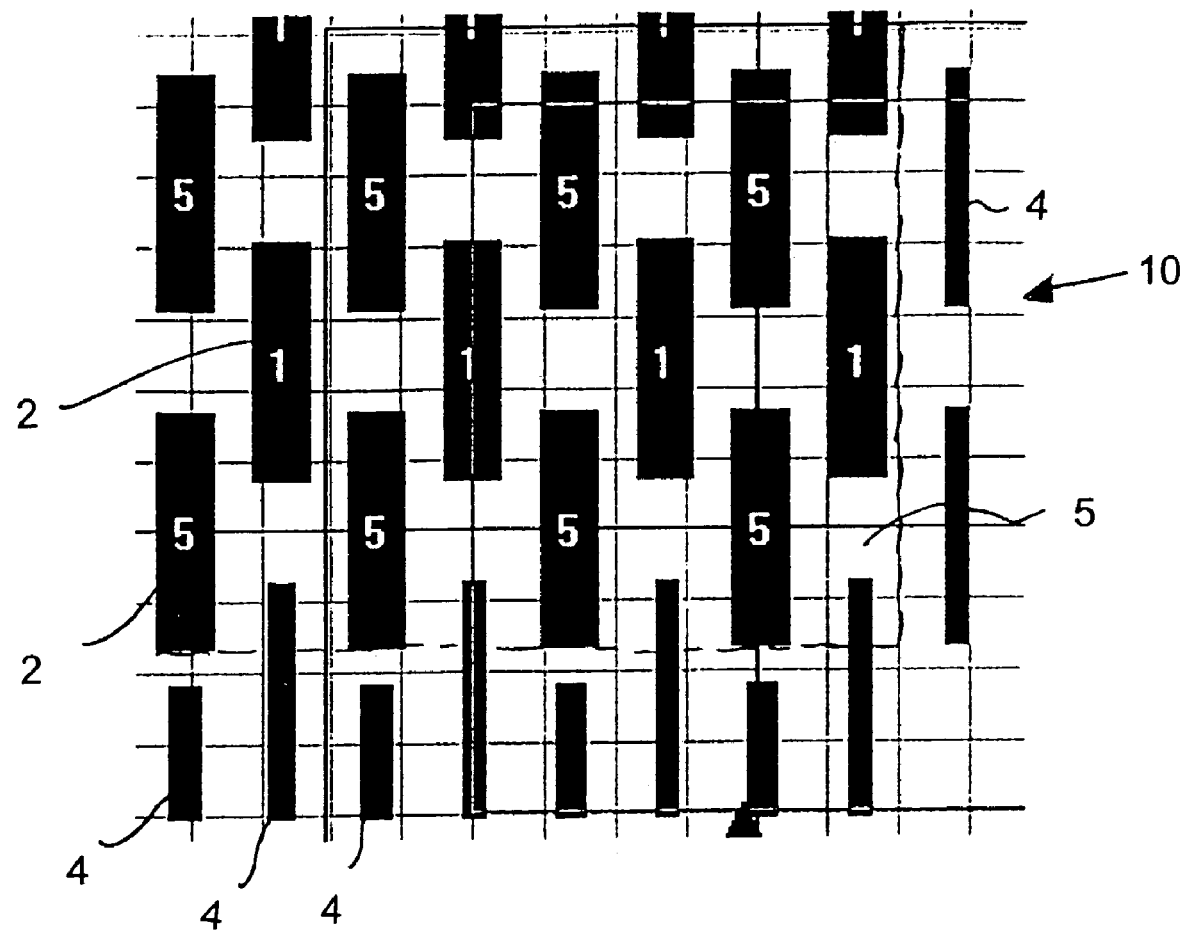
FIG. 3 is a plan view of a third embodiment of the photolithographic mask.

FIG. 3 shows a photolithographic mask in accordance with a third embodiment of the present invention in a plan view. The embodiment shown in FIG. 3 likewise has the radiation-transmissive substrate 10, for example made of quartz glass, to which a radiation-opaque layer is applied. By way of example, black chromium may be used as material for the radiation-opaque layer. Instead of the radiation-opaque layer, however, it is also possible to use a layer made of half-tone material, for example a $MoSi_2O_xN_y$ layer.

In contrast to the embodiments shown previously, however, the embodiment shown in FIG. 3 has no dummy structures. By the radiation-opaque layer, a multiplicity of the main structures 2 are provided. The main structures 2 being formed in such a way that the pattern formed by the main structures 2 is transferred to the resist layer in the event of irradiation, and the main structures 2 being oriented essentially parallel in a first direction (Y direction). Furthermore, by the radiation-opaque layer, a multiplicity of auxiliary structures 4 are provided. The auxiliary structures 4 are formed in such a way that the pattern formed by the auxiliary structures 4 is not transferred to the resist layer in the event of irradiation, and the auxiliary structures 4 are oriented essentially parallel in the first direction (Y direction).

Since, in contrast to the embodiments shown in FIGS. 1 and 2, the dummy structures are entirely dispensed with in the case of the embodiment shown in FIG. 3. The embodiment has the advantage that the area requirement on a semiconductor substrate is again significantly reduced in comparison with the embodiments shown in FIGS. 1 and 2. In particular, the distance between two adjacent regions of main structures can be significantly reduced by virtue of the exclusive use of auxiliary structures.

We claim:

1. A photolithographic mask for use in irradiating radiation-sensitive resist layers on semiconductor substrates for fabricating integrated semiconductor products, the photolithographic mask comprising:
   at least one radiation-transmissive substrate; and
   at least one layer disposed on said radiation-transmissive substrate and selected from the group consisting of radiation-opaque layers and half-tone layers, said layer having:
      at least one region with a multiplicity of main structures, said main structures formed such that a pattern formed by said main structures is transferred to a resist layer in an event of irradiation and first structures produced by said main structures fulfill a predetermined purpose on a semiconductor substrate of a completed semiconductor product;
      dummy structures disposed at least at an edge of said region, said dummy structures formed such that a pattern formed by said dummy structures is transferred to said resist layer in the event of the irradiation and second structures produced by said dummy structures do not fulfill a predetermined purpose on the semiconductor substrate of the completed semiconductor product; and
      at least one auxiliary structure disposed at least at said edge of said region, said auxiliary structure formed such that a pattern formed by said auxiliary structure cannot be transferred to the resist layer in the event of the irradiation.

2. The photolithographic mask according to claim 1, wherein said main structures are oriented substantially parallel to each other in a given direction.

3. The photolithographic mask according to claim 2, wherein said dummy structures are oriented substantially parallel to each other.

4. The photolithographic mask according to claim 3, wherein said dummy structures are oriented in said given direction.

5. The photolithographic mask according to claim 4, wherein said auxiliary structure is one of a multiplicity of auxiliary structures all oriented substantially parallel to each other.

6. The photolithographic mask according to claim 5, wherein said auxiliary structures are oriented in said given direction.

* * * * *